United States Patent [19]

Vogeli et al.

[11] Patent Number: 5,131,954
[45] Date of Patent: Jul. 21, 1992

[54] MONOLITHIC SOLAR CELL ARRAY AND METHOD FOR ITS MANUFACTURING

[75] Inventors: Craig Vogeli, New Baltimore; Prem Nath, Rochester Hills, both of Mich.

[73] Assignee: United Solar Systems Corporation, Troy, Mich.

[21] Appl. No.: 798,848

[22] Filed: Nov. 25, 1991

Related U.S. Application Data

[63] Continuation of Ser. No. 597,407, Oct. 15, 1990, abandoned.

[51] Int. Cl.$^5$ .................... H01L 31/05; H01L 31/08
[52] U.S. Cl. ........................ 136/244; 437/2; 437/4; 437/205
[58] Field of Search ........................ 437/2–5, 437/205; 136/244

[56] References Cited

U.S. PATENT DOCUMENTS

| 4,243,432 | 1/1981 | Jordan et al. | 136/244 |
|---|---|---|---|
| 4,315,096 | 2/1982 | Tyan et al. | 136/244 |
| 4,419,533 | 12/1983 | Czubatyj et al. | 136/259 |
| 4,514,579 | 4/1985 | Hanak | 136/249 |
| 4,594,471 | 6/1986 | Yamazaki | 136/249 |
| 4,670,294 | 6/1987 | Yamazaki | 427/53.1 |
| 4,754,544 | 7/1988 | Hanak | 437/2 |
| 4,758,526 | 7/1988 | Thalheimer | 437/2 |
| 4,773,943 | 9/1988 | Yamaguchi et al. | 136/244 |
| 4,824,488 | 4/1989 | Sakai et al. | 136/244 |
| 4,956,023 | 9/1990 | Tsuge et al. | 136/244 |

FOREIGN PATENT DOCUMENTS

| 1-93174 | 4/1989 | Japan | 136/244 |
|---|---|---|---|
| 1-152769 | 6/1989 | Japan | 136/244 |

Primary Examiner—Aaron Weisstuch
Attorney, Agent, or Firm—Krass & Young

[57] ABSTRACT

Large area, thin-film body of photovoltaic material is subdivided into a plurality of small area devices. Through a selective etching process, a portion of the bottom electrode of each small area device is exposed. A metallic contact member is deposited upon the exposed portion of the electrode and a series connection between adjoining cells is established by interconnecting the metallic contact member of a first cell with the top electrode of an adjoining cell, so as to provide a large-area photovoltaic device including a plurality of interconnected sub-cells.

18 Claims, 4 Drawing Sheets

MONOLITHIC SOLAR CELL ARRAY AND METHOD FOR ITS MANUFACTURING

This is a continuation of co-pending application Ser. No. 597,407 filed on Oct. 15, 1990, now abandoned.

FIELD OF THE INVENTION

This invention relates generally to large area arrays of interconnected photovoltaic devices and more particularly to a large area array comprised of a plurality of smaller area cells disposed in an interconnected relationship upon a single substrate, as well as to methods for the manufacture of the array.

BACKGROUND OF THE INVENTION

Photovoltaic power represents a non-depletable resource which is globally available and non polluting. Because of the increasing scarcity of non-renewable energy sources such as coal, petroleum and uranium and the ever-increasing problems attendant upon their use, it is essential that greater use be made of solar energy.

Single crystal photovoltaic devices, especially crystalline silicon photovoltaic devices have been utilized for some time as sources of electrical power. However, the utility of such crystalline devices has been limited by problems associated with the manufacture thereof. More particularly, single crystalline materials are difficult to produce in sizes substantially larger than several inches in diameter, relatively fragile, relatively thick, and heavy; furthermore, they are expensive and time consuming to fabricate. Recently, considerable effort has been expended to develop systems and processes for preparing thin film semiconductor alloy materials which encompass relatively large areas and which can be deposited so as to form doped semiconductor layers for the production of thin film photovoltaic devices which are substantially equivalent, or superior, to their crystalline counterparts in operation and efficiency. Such materials are disclosed in U.S. Pat. Nos. 4,226,898 and 4,217,374 of Ovshinsky et al. It is now possible to deposit high quality, thin film semiconductor alloy materials over large areas in a roll-to-roll process so as to enable the fabrication of large area devices. Such techniques are disclosed in U.S. Pat. Nos. 4,410,558 and 4,485,125. Such large area deposition techniques offer the advantage of high speed and economy. Generally, it is desirable to subdivide a large area photovoltaic device into a plurality of smaller area devices which are interconnected in series and/or parallel arrays to provide a desired level of voltage and power.

Subdivision and interconnection of a large area device may be carried out by severing the large area device into a plurality of discrete devices which are then interconnected to form a module. This technique is quite labor intensive and more practical for forming modules from a relatively smaller number of large devices. However, it is impractical for interconnecting a large number of small area devices. Another approach to the task of interconnecting small area devices involves the manufacture of monolithic devices. As utilized within the context of the present invention, the term "monolithic" defines an interconnected array formed from a body of semiconductor material which is disposed upon a single large area substrate; in contrast to the discrete cell approach, fabricating a monolithic device involves no severing of the substrate.

Techniques for the manufacture of monolithic arrays of photovoltaic devices have been implemented in the prior art and such techniques typically involve the use of etching, scribing or similar techniques for subdividing semiconductor layers into discrete, electrically isolated portions and employ subsequent steps for depositing additional semiconductor layers and for interconnecting these portions. Prior art techniques generally involve scribing a device into small area cells which are connected in a top to bottom relationship. These techniques necessitate alternating vacuum deposition techniques with scribing or wet-etching or plasma etching steps. The repeated steps of vacuum deposition and atmospheric processing contaminate both the deposition apparatus and the devices, thus reducing the quality of the devices and the efficiency of the process.

In typical prior art techniques, contact between the isolated subcells is generally made between relatively large area portions of adjoining cells. The reason for the large area contact is two fold. Generally, the subcells are fairly small and a large contact area is utilized to accommodate various inaccuracies of the screen printing or lithographic process utilized for interconnection; also, contact is generally made through the use of printable materials such as electrically conductive paste or inks and these materials typically manifest a fairly high contact resistance; consequently, a large area must be utilized to enable full withdrawal of photogenerated power. This large contact area represents a loss of active cell surface. U.S. Pat. No. 4,315,096 of Tyan et al. discloses a technique for fabrication of an array of photovoltaic devices, which technique utilizes a contact region extending across the width, and a substantial portion of the length, of the subcells of the device. Other techniques for the fabrication of interconnected arrays are disclosed in U.S. Pat. No. 4,754,544.

The preparation of most thin film photovoltaic devices involves depositing various semiconductor layers by at least one vacuum step employing a process such as evaporation, sputtering or glow discharge deposition. The presence of volatile species on the device or substrate can contaminate the interior of a vacuum deposition apparatus and degrade the semiconductor layers. Many prior art techniques for the preparation of monolithic photovoltaic devices require vacuum deposition of semiconductors to be carried out on a device which has previously been subjected to wet etching, solvent based coating or other such techniques which can leave a residue of volatile contaminants thereupon. Since prior art techniques require intermingled deposition and etching steps, the semiconductor deposition cannot be separated from the array fabrication. It is not possible to employ a "generic" photovoltaic body which is amenable to various processing techniques. It clearly would be desirable to have a method for manufacturing a monolithic photovoltaic device which separates the semiconductor deposition steps from the wet processing steps.

Prior art interconnection techniques also tend to give a high series resistance array. The interconnections between the cells often rely upon the use of materials which alloy with the various cell components to create a high resistance contact. In other instances, the processing techniques oxidize or otherwise degrade the contacts. It is therefore desirable to interconnect small area subcells by a technique which avoids oxidation or alloying and thereby provides a low resistance contact.

The present invention provides an improved monolithic photovoltaic device comprised of a plurality of interconnected small area subcells disposed upon a single, large area substrate. The connections between the cells are made through the use of materials which retain high conductivity. Thus, contact areas can be made small. The small contact area also provides increased active cell area and hence high photo conversion efficiencies. The device of the present invention is manufactured by a process which segregates the semiconductor deposition and wet processing steps so as to avoid problems of contamination and to speed up process time. These and other advantages of the present invention will be readily apparent from the drawings, discussion and description which follow.

DETAILED DESCRIPTION OF THE INVENTION

Figure 1:
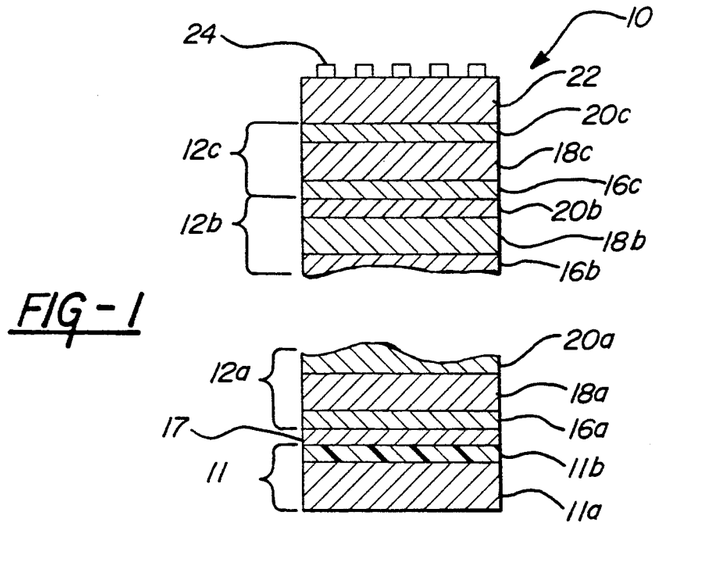
FIG. 1 is a fragmentary, cross-sectional view of a thin film tandem photovoltaic device typical of those which may comprise the subcells of the monolithic array of the present invention.

Referring now to the drawings and particularly to FIG. 1, a photovoltaic cell formed of a plurality of successive P-I-N layers, each of which includes, in the preferred embodiment, an amorphous semiconductor alloy material, is shown generally by the numeral 10. The monolithic array of the present invention may be comprised of a plurality of subcells, each of which is generally similar to that illustrated in FIG. 10, it being understood that other configurations of cell as well as other alloy materials may be similarly employed.

More particularly, FIG. 1 shows a tandem P-I-N type photovoltaic device such as a solar cell made up of stacked, individual P-I-N type cells 12a, 12b and 12c. Below the lower cell 12a is a substrate 11, which in the present invention consists of a relatively thick support layer 11a and a flexible, relatively thin insulating layer 11b, both of which will be described in greater detail hereinbelow.

An electrically conductive bottom electrode layer 17 is operatively disposed atop the insulating layer 11b so as to be in electrical communication with the semiconductor cells 12a, 12b, 12c formed thereatop. It is to be noted at this point that in some cases it is desirable to include a relatively transparent, preferably textured, layer disposed between the bottom electrode layer 17 and the semiconductor body, in this instance the cells 12a, 12b, 12c. This layer which will be described in greater detail with regard to FIG. 3b serves to scatter and redirect light passing through the cell and therefore increase cell efficiency. It is to be understood that the present invention may be practiced with or without such a layer.

Each of the cells 12a, 12b and 12c, in this embodiment, are fabricated with an amorphous semiconductor body containing at least one layer of a silicon or germanium alloy material. Each of the semiconductor bodies includes an n-type conductivity layer 20a, 20b and 20c; an intrinsic layer 18a, 18b and 18c; and a p-type conductivity layer 16a, 16b and 16c. As illustrated, cell 12b is an intermediate cell and as indicated in FIG. 1, additional intermediate cells may be stacked atop cells without departing from the spirit or scope of the present invention. Also, although P-I-N cells are illustrated the present invention may be implemented with N-I-P cells as well as cells of other configurations such as schottky barrier diodes and the like.

Disposed atop the semiconductor layers is a body of transparent conductive oxide (TCO) 22. This layer functions as the upper electrode of the device and cooperates with the bottom contact layer 17 to establish a current path through the device 10. An electrode grid 24 may be added to the device where the cell is of a sufficiently large area, or if the conductivity of the TCO layer 22 is insufficient. The grid 24 shortens the carrier path through the TCO and thus increases the conduction efficiency of the cell 10.

Figure 2:
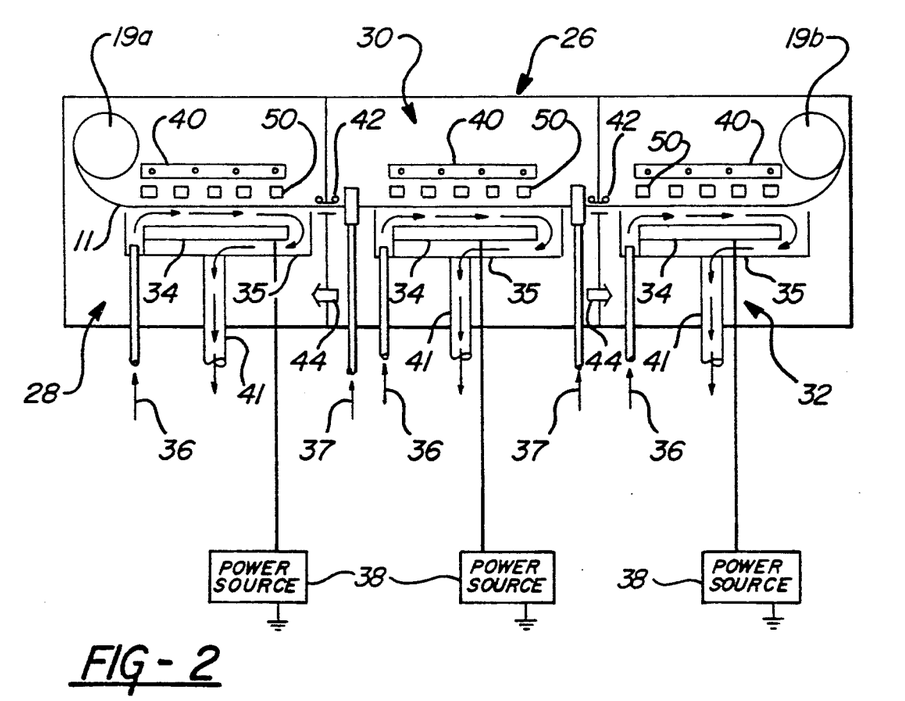
FIG. 2 is a diagrammatic representation of a multiple chamber, glow discharge deposition system adapted for the continuous production of photovoltaic devices of the type shown in FIG. 1.

As noted hereinabove, large area photovoltaic devices having a structure generally similar to that of the device 10 of FIG. 1, may be fabricated in a continuous roll-to-roll process. Turning now to FIG. 2, a diagrammatic representation of a multiple glow discharge chamber deposition apparatus for the continuous production of photovoltaic cells is generally illustrated by the reference numeral 26. The apparatus 26 includes a plurality of isolated, dedicated deposition chambers, each chamber of which is interconnected by a gas gate through which sweep gases and a web of substrate material 11 are adapted to pass.

The apparatus 26 is adapted to mass produce, in the preferred embodiment, a large area, semiconductor cell having a P-I-N, or N-I-P configuration. The apparatus 26 includes at least one triad of deposition chambers 28, 30, 32. Each triad of deposition chambers comprises a first chamber 28 in which a p-type conductivity semiconductor layer is deposited onto the substrate 11 as it passes therethrough, a second deposition chamber 30 in which an intrinsic amorphous semiconductor layer is deposited atop the p type alloy layer as a substrate 11 passes therethrough and a third deposition chamber 32 in which an n type conductivity semiconductor layer is deposited atop the intrinsic layer as the substrate 11 passes therethrough. It should be apparent that although one triad of the deposition chambers has been illustrated, additional triads, or additional chambers, may be added to the apparatus to provide the capability of producing cells having an number of stacked P-I-N type semiconductor layers. It should be kept in mind that the deposition chamber of FIG. 2 is illustrative of one apparatus for the manufacture of the large area body of photovoltaic material and various other deposition techniques such as evaporation, electroplating, plasma spray and the like may be similarly employed.

Each deposition chamber 28, 30 and 32 of the triad is adapted to deposit a single semiconductor layer by glow discharge deposition of a feed gas. To that end, each of the deposition chambers 28, 30 and 32 includes a cathode 34, a shield 35 disposed about each of the cathodes 34, a process gas supply conduit 36 for introducing process gas mixtures into the area adjacent the cathode, a power source 38 such as an alternating current generator, an evacuation conduit 41 for removing unused or spent process gases and non-deposited plasma components, a plurality of transversely extending magnetic elements 50, a plurality of radiant heating elements shown schematically as 40, and a gas date 42 operatively connecting the intrinsic deposition chamber to each of the chambers. Further, inert sweep conduits 37 are disposed on opposed sides of the intrinsic deposition chamber 30 for establishing a unidirectional flow of inert gas through the gas gate 42. Although the gas gates 42 are depicted as establishing a unidirectional flow of inert gas, the gas gates 42 may also have other types of internal flow of sweep gas established as long as the flow operates to prevent diffusion of process gas between the adjacent deposition chambers.

The supply conduits 36 are operatively associated with the respective cathodes 34 to deliver process gas mixtures to the plasma regions which are created in each deposition chamber between said cathodes 34 and a substrate 11. The cathode shields 35 are adapted to operate in conjunction with the web of substrate material 11 and the evacuation conduit 41 to substantially confine the plasma within the cathode region of the deposition chambers.

The alternating current generators 38 operate in conjunction with the cathodes 34, the radiant heaters 40 and the ground and substrate 11 to form the plasma and disassociate the process gases entering the plasma region of the deposition chambers into deposition species which form a semiconductor layer upon the substrate. The substrate 11 may be maintained substantially flat by the plurality of rows of magnetic elements 50.

To form the photovoltaic cell 10 of FIG. 1, a p-type semiconductor layer is deposited onto the substrate 11 in the deposition chamber 28, an intrinsic, amorphous semiconductor layer is deposited atop the p-type layer in the deposition chamber 30, and an n-type semiconductor layer is deposited atop the intrinsic layer in the deposition chamber 32. As a result, the apparatus 26, deposits at least three successive semiconductor layers onto the substrate 11 and the intrinsic layer deposited in deposition chamber 30 differs in composition from the layers deposited in deposition chambers 28 and 32 by the absence of at least one element which will be referred to as the dopant or doping species. In order to form subsequent stacked P-I-N type cells, the substrate is either rewound and run through the chambers again or an apparatus including addition triads is employed.

The photovoltaic material provided by the apparatus of FIG. 2 may be considered to be a composite of substrate, bottom electrode material, semiconductor material and top electrode material, which composite constitutes one very large photovoltaic device. As mentioned herein above, it is generally desirable to subdivide this large area device into a plurality of small devices interconnected in a series and/or parallel array so as to increase the device voltage and provide defect and damage tolerance.

Figure 3A:
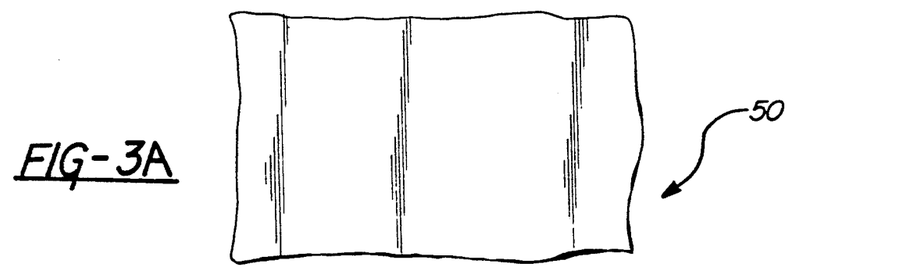
FIG. 3A is a top plan view of a portion of a large area photovoltaic device prior to subdividing.
Figure 3B:
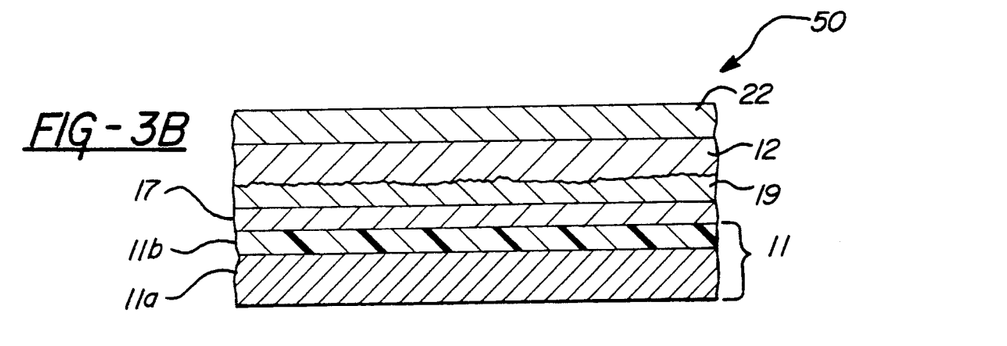
FIG. 3B is a cross-sectional view of the large area device of FIG. 3A.

Referring now to FIG. 3A there is shown a top plan view of a large area body of composite photovoltaic material 50. FIG. 3B illustrates this body of material 50 in cross-section and it will be seen from the figure that the body is comprised of an electrically insulating substrate 11, which in this instance is comprised of a body of stainless steel of approximately 8 mils thickness 11a having an insulating body, such as a layer of a polymer such as polyimide 11b thereupon. Composite substrates of this type are disclosed in U.S. Pat. No. 4,514,583, the disclosure of which is incorporated herein by reference. It is to be understood that the present invention may be implemented utilizing any substrate provided it is electrically insulating and is capable of supporting the semiconductor and electrode layers thereupon. Among such other substrates are free standing films of polymeric material, ceramic, glass and the like.

Immediately atop the substrate layer 11 is a bottom electrode layer 17 which, in this instance, is formed from a vacuum deposited layer of aluminum. The bottom electrode layer 17 has a highly reflecting surface and further functions to redirect light which has passed through the semiconductor layer back through that layer so as to further increase device efficiency.

In the illustrated embodiment, a layer 19 of a textured, relatively transparent, relatively conductive oxide material is disposed atop the bottom electrode layer 17. This layer 19 has a roughened or textured top (i.e., light facing) side and functions to scatter light passing therethrough so as to cause reflected light to strike the semiconductor body an oblique angle and thereby increases total internal reflection and hence cell efficiency. The layer 19 preferably also has a conductivity adjusted to cause it to act as a "buffer" to large current flows. This layer thus functions to limit passage of relatively large amounts of current through the cell, as would occur if the cell developed an internal short. Relatively lower densities of current which flow during normal operation of the cell are not significantly impeded. The textured layer 19 together with the reflective bottom electrode 17, constitute what is termed a textured back reflector.

Immediately atop the textured layer 19 is a semiconductor body 12, which may constitute the aforementioned amorphous silicon or germanium alloy or it may comprise any other thin film semiconductor material such as polycrystalline silicon, amorphous silicon-carbon alloy materials, polycrystalline germanium, copper indium diselenide, cadmium sulfide, cadmium selenide, gallium arsenide, or the like. Disposed atop the semiconductor body 12 is a top electrode layer 22 comprised of a transparent conductive oxide material such as indium oxide, tin oxide or combinations thereof as noted with regard to FIG. 1.

Figure 4A:
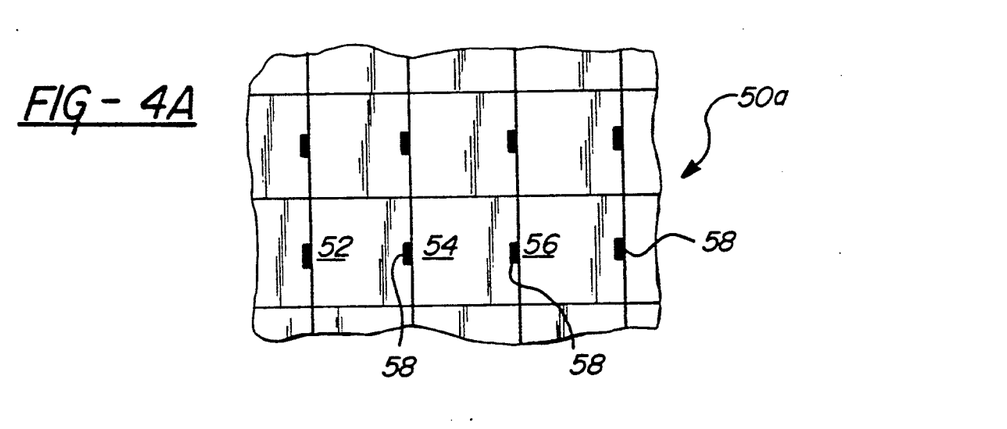
FIG. 4A is a top plan view of the device of FIG. 3A at a first step of processing.
Figure 4B:
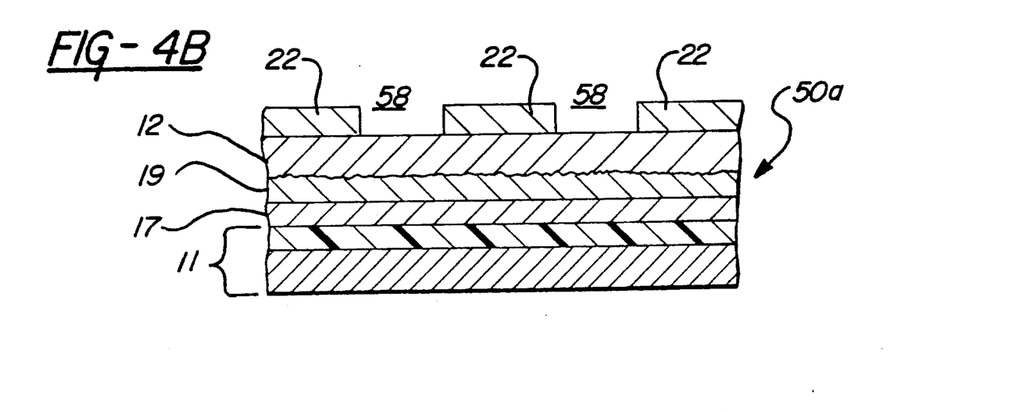
FIG. 4B is a cross-sectional view of a portion of the device of FIG. 4A illustrating two contact pad areas.

In the first step of processing, the large area body of photovoltaic material is subdivided into what will become a plurality of small area subcells. Referring now to FIG. 4A there is shown the large area device 50a as subdivided. Subdivision is accomplished by etching through the transparent conductive oxide layer 22 so as to form a plurality of separate regions, for example regions 52, 54 and 56. It will be noted that each region 52, 54, 56 includes what is termed a contact pad area 58. Referring now to FIG. 4B, there is shown an enlarged, cross-sectional view of the device 50a of FIG. 4A taken through, and illustrating, two of the contact pad areas 58.

The subdivision of the TCO layer 22 is preferably accomplished by a photomask-etch process. In a typical process, a resist pattern is screen printed onto the large area photovoltaic composite utilizing an etch material such as Colonial ER-1093 etch resist. This material is typical of many screen-printable, etch resist materials and is available from the Colonial Corporation. After the etch resist is screen printed, the large area device is baked at 90° C. for two minutes to cure the resist.

The particular etchant utilized will depend upon the exact composition of the TCO layer. In general, most TCO layers are comprised of indium and/or tin oxides and are very easily etched by a mixture of zinc dust and hydrochloric acid. In a typical process, the resist masked device is placed in a tray, sprinkled with zinc dust and gently wiped with a 5% hydrochloric acid solution. This quickly removes any exposed TCO, at which time the device is water rinsed, wiped and dried. Etching is followed by an additional bake step at 90° C. for two minutes to complete drying. After bake-out, the substrate is stripped of the resist utilizing 1,1,1 trichloroethane.

Following the etch of the TCO layer, it has been found advantageous to further passivate the device to remove any defects in the nature of shorts or shunts which may occur within the active areas of each of the subcells. Such passivation is accomplished by passing a reverse bias current through the device in an electrolyte bath comprised of an aqueous solution of aluminum chloride and having a conductivity of approximately 66 mhos. Passage of a reverse bias current of approximately four volts dc through the device for two seconds will passivate defects present. After passivation, the device is blown dry with air or nitrogen and baked at 90° C. for five minutes to complete drying.

Figure 5:
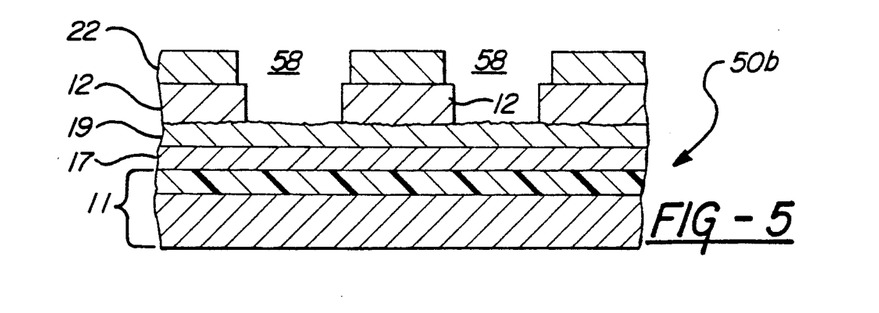
FIG. 5 is a cross-sectional view showing the device of FIG. 4B at a second stage of processing.

In the next step of processing, the semiconductor material is etched away in at least the contact pad areas of the device and preferably along the entire border of each of the subcells. Referring now to FIG. 5, there is shown the large area device 50b after the etching of the semiconductor layer. After this step, each of the contact pad areas 58 now extends down to the transparent textured layer 19.

The particular process utilized to etch the semiconductor body will depend upon the nature of the semiconductor. In the instance of silicon and/or germanium alloy materials a dry, gaseous, plasma etch has been found to be most advantageous. In a typical etching process, an etch resist is screen printed onto the large area device. A typical etch resist comprises Colonial ER-1093 as mentioned herein above. The material is screen printed and cured at 90° C. for two minutes at which time the resist patterned device is placed into a sealed plasma etch chamber. The chamber is pumped down to a pressure of 30 mTorr. A flow of 200 sccm of nitrogen trifluoride is introduced into the chamber and the exhaust pressure of the chamber is maintained at 125 mTorr. Fifty watts of radio frequency power is introduced into the chamber via a cathode and creates a plasma of excited nitrogen and fluorine species. The large area substrate is maintained in the chamber for approximately 10-12 minutes during which time the plasma etches away all exposed semiconductor material. The plasma is not capable of etching the exposed texture transparent oxide layer 19 and upon completion of the plasma etch process, a structure similar to that shown in FIG. 5 is created. The chamber is raised to atmospheric pressure and the large area device removed.

At this time, the semiconductor resist pattern is not removed and a further back reflector etch pattern is provided atop portions of the textured layer 19 exposed in the contact pad areas 58. This pattern covers only a portion of the exposed layer. Again, a variety of resist materials may be employed however the Colonial ER-1093 etch resist has been found to be quite suitable for most purposes. After the back reflector etch pattern is properly formed, the large area device is further etched in a solution of 37.5% ferric chloride hydrate, 52.5% water and 10% concentrated hydrochloric acid. The device is immersed in the etching solution for approximately 30 seconds to one minute and removal of the back reflector layers may be visually confirmed. After etching, the device is rinsed, dried and the resist is removed.

Figures 6A, 6B:
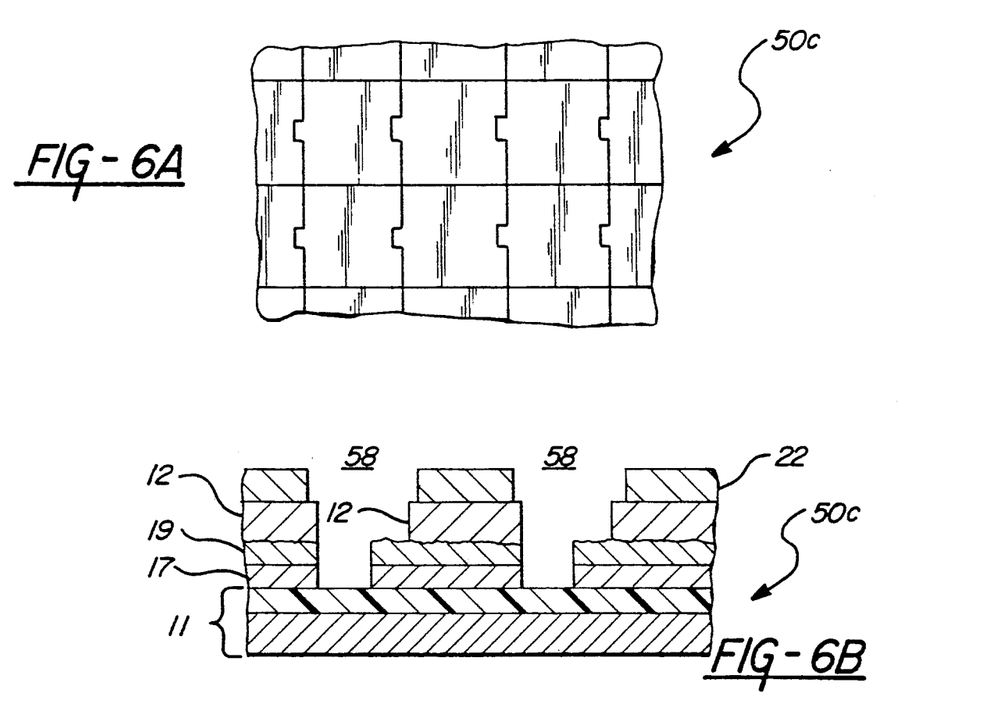
FIG. 6A is a top plan view of the monolithic photovoltaic device at a third stage of processing.
FIG. 6B is a cross-sectional view of a portion of the device of FIG. 6A illustrating two of the contact pad areas thereof.

Referring now to FIG. 6A and FIG. 6B there is shown the device 50c after completion of the back reflector etch step. It will be noted that the contact pad area 58 now includes an exposed portion of the insulating substrate 11 as well as a minor portion of the bottom electrode layer 17 and overlying textured oxide layer 19 (collectively referred to as back reflector) projecting thereinto.

Figure 7:
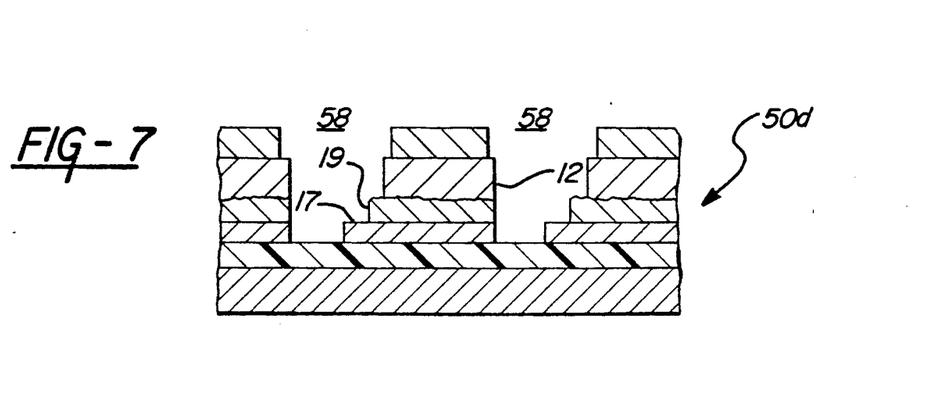
FIG. 7 is a cross-sectional view showing the device at a fourth stage of processing.

In the next step of the process, a portion of the textured oxide layer 19 which projects into the contact pad area is removed and FIG. 7 depicts the structure resultant from this step. Etching of the textured oxide layer is accomplished by screening a resist pattern such as Colonial ER-1093 onto the large area device. After the resist area is placed, etching is carried out in a 5% nitric acid solution for approximately 1-2 seconds after which the device is dried at 90° C. for approximately two minutes.

The resultant structure 50d is shown in FIG. 7 and it will be noted that the contact pad regions 58 now include a minor portion of the bottom electrode layer 17, exposed therein and this portion is laterally spaced from the semiconductor body 12. In the instance where the textured oxide layer 19 is employed, etching is carried out to provide a step-like structure which assures lateral spacing.

The resist pattern is kept in place and in a subsequent step, a metallic contact member 60 (shown in FIG. 8) is deposited onto the exposed minor portion of the bottom electrode layer 17. It is to be noted that this contact member 60 is laterally spaced from the semiconductor body 12. One preferred metal for the formation of the contact member 16 is indium and this material may be readily deposited by a vacuum evaporation process. Typically, 5,000 angstroms of indium are deposited at the rate of 50 angstroms/second onto the large area device which is maintained at room temperature. The present invention is not limited to the use of indium and any easy to deposit, relatively high conductivity material may be employed in the process provided it does not alloy or otherwise react with other materials in the device. Some of the most preferred materials include metals which do not readily oxidize, or metals which have electrically conductive oxides. Conductive oxides also may be utilized as contact members. Also, the invention is not limited to use of evaporation techniques; the contact member may be deposited by plating, sputtering, chemical vapor deposition, electro-plating, electroless plating and the like. Among some of the preferred metals for use in fabricating contact members are indium, indium oxide, tin, tin oxide, zinc, zinc oxide, silver, gold, platinum, aluminum, and combinations thereof.

Figure 8:
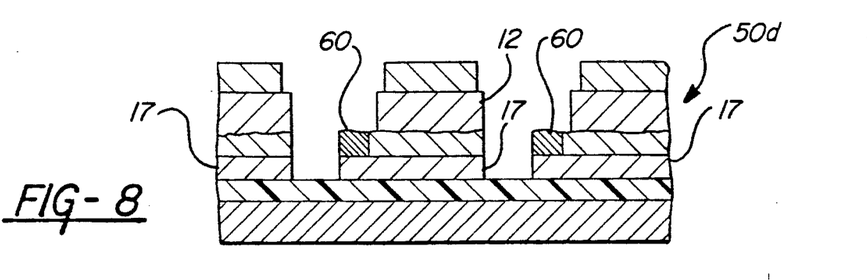
FIG. 8 is a cross-sectional view showing the device at a fifth stage of processing.

Following the deposition of the metallic member 60, the resist layer and excess metal are stripped away to provide a structure similar to 50d of FIG. 8.

Figure 9:
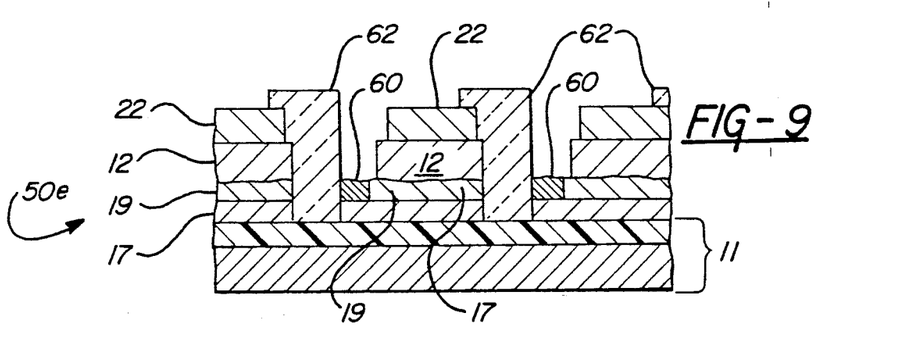
FIG. 9 is a cross-sectional view showing the device at a sixth stage of processing.

Following the deposition of the contact member, an electrically insulating body is applied to the large area device in the region of the contact pad area. This insulating body is best seen in FIG. 9 by reference numeral 62. The insulating body 62 is deposited in a pattern which covers the exposed portion of the substrate 11 in the contact pad area. The insulating body further covers the edges of the bottom electrode 17, textured layer 19, semiconductor body 12 and top conductive oxide electrode 22, proximate the contact pad area. It is notable that the insulating body 62 is applied so as to leave a substantial portion of the metallic contact member 60 exposed.

The insulating body 62 may comprise any one of a variety of organic compounds or inorganic materials such as oxides, nitrides and the like. The insulating body 62 may be deposited a variety of methods including by vacuum techniques such as evaporation, glow discharge, sputtering the like or it may be deposited by screen printing, painting and similar techniques combined with photo masking. One particularly preferred technique involves the screen printing of a thin lacquer onto the large area device. One lacquer having utility in the present invention is a product sold by the Naz-Dar Corporation under the designation IO-170. In use, this lacquer is typically thinned with thinner T-925 and is applied by screen printing. The device having the lacquer pattern printed thereupon is cured by baking at 90° C. for ten minutes to provide a structure substantially similar to that of FIG. 9, wherein the insulating body is shown by reference numeral 62.

Figure 10A:
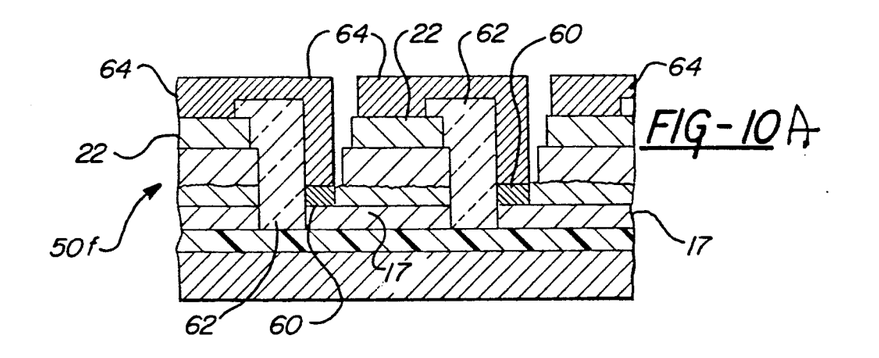
FIG. 10A is a cross-sectional view showing a portion of the completed monolithic device of the present invention.

In a subsequent processing step, an electrically conductive grid pattern is provided which interconnects adjoining small area cells into a series connected array. This grid pattern is best seen in FIG. 10A and is illustrated at reference numeral 64. The grid pattern interconnects the contact pad 60, which is in electrical communication with the bottom electrode 17 of a first small area cell with the top electrode 22 of an adjoining cell so as to create a series connected array 50f illustrated in FIG. 10A.

Figure 10B:
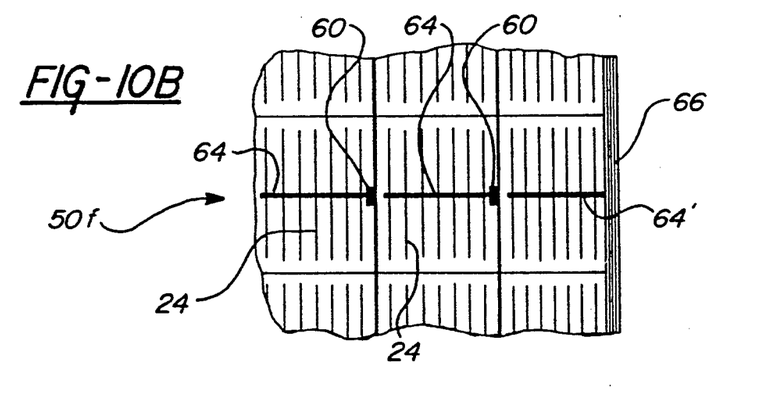
FIG. 10B is a top planned view of a portion of a completed monolithic area of the present invention.

FIG. 10B is a top plan view of a portion of the device 50f better illustrating the grid pattern. The figure shows the central portion 64 of the grid pattern in electrical communication with the metallic contact member 60 so as to establish the series interconnection. Associated in electrical communication with the central finger 64 are a plurality of grid fingers 24 similar to those illustrated with reference to FIG. 1. The grid fingers 24 collect current from the surface of the photovoltaic device and convey that current to the central finger 64. At the edge of the large area device it will be noted that the particular central finger 64' is in electrical communication with a large area bus bar 66 which forms one of the main terminals of the large area device 50f.

The grid pattern is preferably applied to the device by screen printing a silver based ink or paste material thereupon. One preferred silver paste material is sold by the DuPont Corporation under the designation 5007 silver ink. This material is advantageously applied through standard screen printing techniques and once applied is cured by baking one hour at 125° C. to provide a low resistivity, current-carrying structure. The bus bar 66 may be fabricated from the same silver paste; however, it has been found more advantageous to employ a metallic strip fabricated from copper or other such material for this structure. Such metallic strips may be simply applied by adhesively affixing them to the edge of the large area device and connecting the central grid fingers 64 to them.

Following the application of the grid pattern, the large area device is preferably encapsulated in a protective polymeric material. One preferred material comprises ethylene vinyl acetate. This polymer may be laminated onto the light incident surface of the device and under moderate heat and pressure flows around the various cell structures to prevent mechanical and/or ambient atmospheric damage. The device may further include a protective fluoro polymer layer atop the EVA. In some instances, glass may be substituted as a protective member.

The foregoing describes one particular technique for the preparation of large area photovoltaic devices. It is to be understood that various modifications of the foregoing process may be employed within the scope of the present invention. The invention may be readily adapted to interconnect a variety of large area, thin film electronic devices including photosensor arrays and the like as well as photovoltaic devices. The invention is not to be limited to any one class of photovoltaic materials or to any particular etchants, masking materials, or processing techniques.

The foregoing is illustrative of a preferred embodiment of the present invention and is not a limitation upon the practice thereof. It is the following claims, including all equivalents which define the scope of the invention.

We claim:

1. A method of manufacturing a photovoltaic device of the type comprising a plurality of photovoltaic cells disposed upon an electrically insulating substrate and electrically interconnected in a series relationship, the method including the steps of:

providing a photovoltaic composite comprising: an electrically insulating substrate a layer of bottom electrode material disposed upon the substrate, a body of semiconductor material having a first side thereof disposed in electrical communication with the layer of bottom electrode material and a layer of top electrode material disposed in electrical communication with a second side of the semiconductor body;

etching away selected portions of said layer of top electrode material, said semiconductor body and said bottom electrode material so as to provide a plurality of grooves which have the substrate exposed at the bottom thereof and which cooperate to define said plurality of cells;

defining a contact pad area associated with each of said cells, each contact pad being coextensive with only a minor portion of one of said plurality of grooves;

etching away the top electrode material and the body of semiconductor material in each of said contact pad areas so as to define an exposed portion of the bottom electrode material corresponding to said contact pad area;

vacuum depositing a contact member upon each of said exposed portions of bottom electrode material, said contact member being laterally spaced from the semiconductor body;

depositing a body of an electrically insulating material upon the portions of the substrate exposed in the portion of each groove which is coextensive with a respective one of said contact pad areas and controlling the depositing of said electrically insulating material so that the contact member is substantially free of said insulating material; and disposing an electrically conductive interconnect member in electrical contact with the contact member of a first cell and the top electrode member of an adjacent cell, whereby series electrical communication is established therebetween.

2. A method as in claim 1, wherein the steps of etching away portions of the layer of top electrode material, etching away portions of the semiconductor material, and etching away portions of the layer of bottom electrode material further comprise etching away said materials in a pattern which defines the plurality of photovoltaic cells.

3. A method as in claim 1, wherein the step of providing a photovoltaic composite further comprising providing a layer of transparent, electrically conductive material interposed between said layer of bottom electrode material and the first side of said semiconductor body.

4. A method as in claim 1, wherein said body of semiconductor material includes at least one triad of superposed layers of P, I, and N-type semiconductor materials.

5. A method as in claim 1, wherein said body of semiconductor material includes at least one layer of an amorphous silicon alloy material.

6. A method as in claim 3, including the further step of etching away a portion of the transparent electrically conductive material in each of said contact pad areas concomitant with the step of etching away said portion of the layer of bottom electrode material, said etched away portions being generally coextensive.

7. A method as in claim 6, including a further step which is implemented after the etching away of the portions of transparent conductive material and bottom electrode material, which step comprises: etching away a additional portion of the transparent conductive material which overlies the minor portion of the layer of bottom electrode material in each of said contact pad areas, whereby a portion of the bottom electrode layer, free of overlying materials, is exposed.

8. A method as in claim 1, wherein the a contact member comprises a member selected from the group consisting of: indium, indium oxide, tin, tin oxide, zinc, zinc oxide, silver, gold, and combinations thereof.

9. A method as in claim 1, wherein the electrically insulating material comprises a layer of lacquer.

10. A method as in claim 1, wherein the step of disposing an electrically conductive interconnect member comprises printing a pattern of electrically conductive paste onto the photovoltaic device.

11. A method as in claim 10, wherein the step of printing a pattern of electrically conductive paste comprises printing a pattern including grid fingers.

12. A large area photovoltaic device of the type comprising a plurality of series-connected cells disposed on an electrically insulating substrate, said device comprising:

an electrically insulating substrate;

a composite photovoltaic body comprising a bottom electrode layer disposed on said substrate, a layer of semiconductor material disposed atop the bottom electrode layer and a layer of top electrode material disposed atop the layer of semiconductor material, said photovoltaic body further including a first and a second group of grooves defined therein, each groove extending through the top electrode layer, semiconductor layer and bottom electrode layer so as to expose a portion of the substrate at the bottom thereof, the grooves of the first group each intersecting the grooves of the second group at an angle so as to define a plurality of electrically isolated photovoltaic cells;

each of said cells including a contact pad area which is defined by an exposed portion of the layer of bottom electrode material which is free of the layer of top electrode material and the layer of semiconductor material, the contact area of each cell is disposed to adjoin and be coextensive with only a minor portion of the length of a groove of the first group;

a contact member disposed upon the exposed portion of the layer of bottom electrode material disposed in the contact pad area of each cell;

a body of electrically insulating material disposed in, and filling, that portion of each groove of the first group which adjoins the contact pad area of a cell; and an electrically conductive member associated with each cell and disposed so as to electrically communicate with the bottom electrode of that cell and the top electrode of an adjoining cell whereby a series electrical connection is established therebetween.

13. A photovoltaic device as in claim 12, wherein the photovoltaic body thereof includes at least one triad of superposed layers of P-type, I-type, and N-type semiconductor material.

14. A photovoltaic device as in claim 12, wherein said body of photovoltaic material includes at least one layer of a semiconductor material selected from the group consisting of: amorphous silicon alloy materials, amorphous germanium alloy materials, amorphous silicon-carbon alloy materials, polycrystalline silicon, polycrystalline germanium, cadmium sulfide, cadmium selenide, copper indium diselenide, gallium arsenide, and combinations thereof.

15. A photovoltaic device as in claim 12, wherein said contact member comprises a material selected from the group consisting of: indium, indium oxide, tin, tin oxide, silver, gold, aluminum, zinc, platinum, zinc oxide, and combinations thereof.

16. A photovoltaic device as in claim 12, wherein the electrically conductive member comprises a screen printed pattern of electrically conductive paste.

17. A photovoltaic device as in claim 12, wherein each of said cells includes a current collecting grid pattern associated in electrical communication with the electrically conductive member.

18. A photovoltaic device as in claim 12, wherein the bottom electrode layer comprises a reflective, metallic material having a layer of textured, transparent, electrically conductive material disposed thereatop.

* * * * *